United States Patent
Bizzan

[11] Patent Number: 6,154,548
[45] Date of Patent: Nov. 28, 2000

[54] AUDIO MUTE CONTROL SIGNAL GENERATING CIRCUIT

[75] Inventor: Sami S. Bizzan, Markham, Canada

[73] Assignee: ATI Technologies, Thornhill, Canada

[21] Appl. No.: 08/937,926

[22] Filed: Sep. 27, 1997

[51] Int. Cl.[7] .................................................. H04B 15/00
[52] U.S. Cl. ............................................................ 381/94.5
[58] Field of Search ................................... 381/94.5, 119, 381/94.1, FOR 124; 455/218, 219, 220, 221, 222, 223; 330/51, 69, 133, 149

[56] References Cited

U.S. PATENT DOCUMENTS

| | | | |
|---|---|---|---|
| 4,809,337 | 2/1989 | Scholz et al. | 381/94.5 |
| 5,151,942 | 9/1992 | Sasaki | 381/94.5 |
| 5,263,184 | 11/1993 | Nakamura et al. | 455/220 |
| 5,570,427 | 10/1996 | Nishioka | 381/84.5 |
| 5,642,076 | 6/1997 | Naokawa et al. | 381/94.5 |
| 5,703,528 | 12/1997 | Nebuloni et al. | 381/94.5 |
| 5,734,729 | 3/1998 | Tran | 381/94.5 |
| 5,740,453 | 4/1998 | Lada, Jr. | 381/94.5 |
| 5,757,940 | 5/1998 | Iinuma | 381/94.5 |
| 5,838,803 | 11/1998 | Keum et al. | 381/94.5 |
| 5,915,030 | 6/1999 | Viebach | 381/94.5 |
| 5,966,406 | 10/1999 | Hsieh et al. | 375/225 |
| 6,016,352 | 1/2000 | Barmore | 381/94.5 |
| 6,041,416 | 3/2000 | Lada, Jr. | 713/330 |

*Primary Examiner*—Vivian Chang
*Assistant Examiner*—Xu Mei
*Attorney, Agent, or Firm*—Markison & Recamp, P.C.

[57] ABSTRACT

An audio mute control signal generating circuits uses a high gain differential amplifier that switches transitions at the zero-crossing of the input audio so that the clock for a mute enable circuit is more readily controlled. The high gain differential amplifier includes a modification to a conventional type first operational amplifier in a cascaded operational amplifier configuration wherein additional cascade feedback transistors are added in parallel with differential output transistors from the first stage and are connected to an input stage of the second cascaded operational amplifier. With this configuration, when the output common mode voltage drops, the channel conductance of the cascade feedback transistors increases to oppose the change thereby increasing the common mode voltage to a suitable level so that the second stage does not inadvertently shut off.

14 Claims, 4 Drawing Sheets

AUDIO MUTE CONTROL SIGNAL GENERATING CIRCUIT

BACKGROUND OF THE INVENTION

The invention relates generally to audio mute systems and more particularly to audio mute control signal generating circuits.

More advanced digital audio functions are being planned for multimedia personal computers. For example, multimedia computers are proposed to include processing capabilities and mixing capabilities for multiple streams of audio received from a number of different audio sources such as digital versatile discs (DVD's), CDs, TV tuners, stereo analog inputs, auxiliary inputs, line inputs and other sources. Audio coders and decoders (codecs) are typically used to facilitate the digital signal processing of the audio signals from the various audio sources. High quality audio systems are in demand for such complex audio environments.

With the increase of additional audio streams being processed and mixed, a computer user may wish to mute or unmute an audio signal at any given time. For example, when a telephone call arrives through a modem and the computer is playing a movie on the screen of the computer from a DVD player, a user may wish to mute the audio from the DVD player so that a received telephone call may be heard. Therefore, muting or unmuting of the audio should be accomplished in a proper fashion so that no "clicks or pops" are heard over the computer speakers during a mute/unmute operation. When a mute state is desired, and the mute control system allows residual audio to pass prior to a complete mute, the residual audio can cause the "clicks or pops." To help reduce the residual audio, audio mute circuits typically attempt to detect the zero-crossing of an input audio signal so that the mute or unmute can occur upon the next zero-crossing to take advantage of a zero audio signal condition.

It is important in the computer systems that additional components such as audio control systems be small to help reduce cost and reduce the size of the overall system. Where the input audio is converted to differential input for zero-crossing detection, it is important that the differential converter be robust enough to accommodate parametric variations when the circuit is fabricated on an integrated circuit chip. However, problems can arise when the input audio to the differential converter is at a low level, such that the zero-crossing detection circuitry does not detect low audio levels. In such instances, the mute circuit will not properly mute or unmute the audio and will allow the low level audio to pass through to the speakers.

In traditional differential amplifier structures, process variations in low level input signals can tend to move the output common mode voltage of one differential amplifier stage below the threshold of an input transistor device of a cascaded second differential amplifier stage and hence typically cannot be used to drive an identical subsequent operational amplifier. The problem arises due primarily to integrated circuit process variations such that an output common mode voltage of the differential operational amplifier first stage can shift to a very low level causing an input stage of the second cascaded differential amplifier to be turned off completely when low input audio signals are present.

One traditional common mode feedback technique includes using a separate amplifier and associated resistors in a feedback loop as a comparator circuit to generate a bias voltage for a cascade transistor based on a reference voltage. However, such a technique can be too large and costly for small integrated circuits. Another type of conventional lower cost approach is to use a resistor network to generate an increase in output common mode voltage of the first stage. However, such techniques still require large resistors that take up large integrated circuit real estate and also provide less accurate control than the more complex comparator approach.

Consequently there exists a need for an audio mute control signal generating circuit that provides detection of low audio input signals and provides suitable zero-crossing detection and mute control to reduce the effects of residual audio.

BRIEF DESCRIPTION OF THE DRAWINGS

The features of the present invention together with the advantages thereof, may be understood by reference to the following description taken in conjunction with the accompanying drawings wherein.

DETAILED DESCRIPTION OF THE INVENTION

Generally, the disclosed audio mute control signal generating circuit includes a high gain differential amplifier, such as a cascaded differential amplifier, that receives input audio and amplifies the input audio and converts the input audio to a digital signal. The digital signal from the high gain differential amplifier is used as a clock to enable a mute enable circuit. The high gain differential amplifier switches transitions at the zero-crossing of the input audio so that the clock for the mute enable circuit is more readily controlled. The high gain differential amplifier includes additional common mode feedback to ensure that the output common mode voltage of a first amplifier stage is high enough for a second stage of the high gain differential amplifier to work properly even with process variations to the internal amplifier transistors. The output signal generated by the high gain differential amplifier is used as a clock to drive a flip/flop which in turn controls the transition timing of an input mute enable/disable signal to generate an output mute control signal to align with a zero crossing of input audio.

More specifically, the audio mute control signal generating circuit incorporates a modification to a conventional type first operational amplifier in a cascaded operational amplifier configuration wherein additional cascade feedback transistors are added in parallel with differential cascade transistors from the first stage and are connected to an input stage of the second cascaded operational amplifier. With this configuration, when the output common mode voltage drops, the channel conductance of the cascade feedback transistors increases to oppose the change thereby increasing the common mode voltage to a suitable level so that the second stage does not inadvertently shut off. Also, for large input level differential signals, the modification facilitates one of the output signals to the second stage to continuously be above a threshold of an input device of the second stage and therefore the mute control generating circuit is capable of turning on at least one side of the second stage differential input stage.

Figure 1:
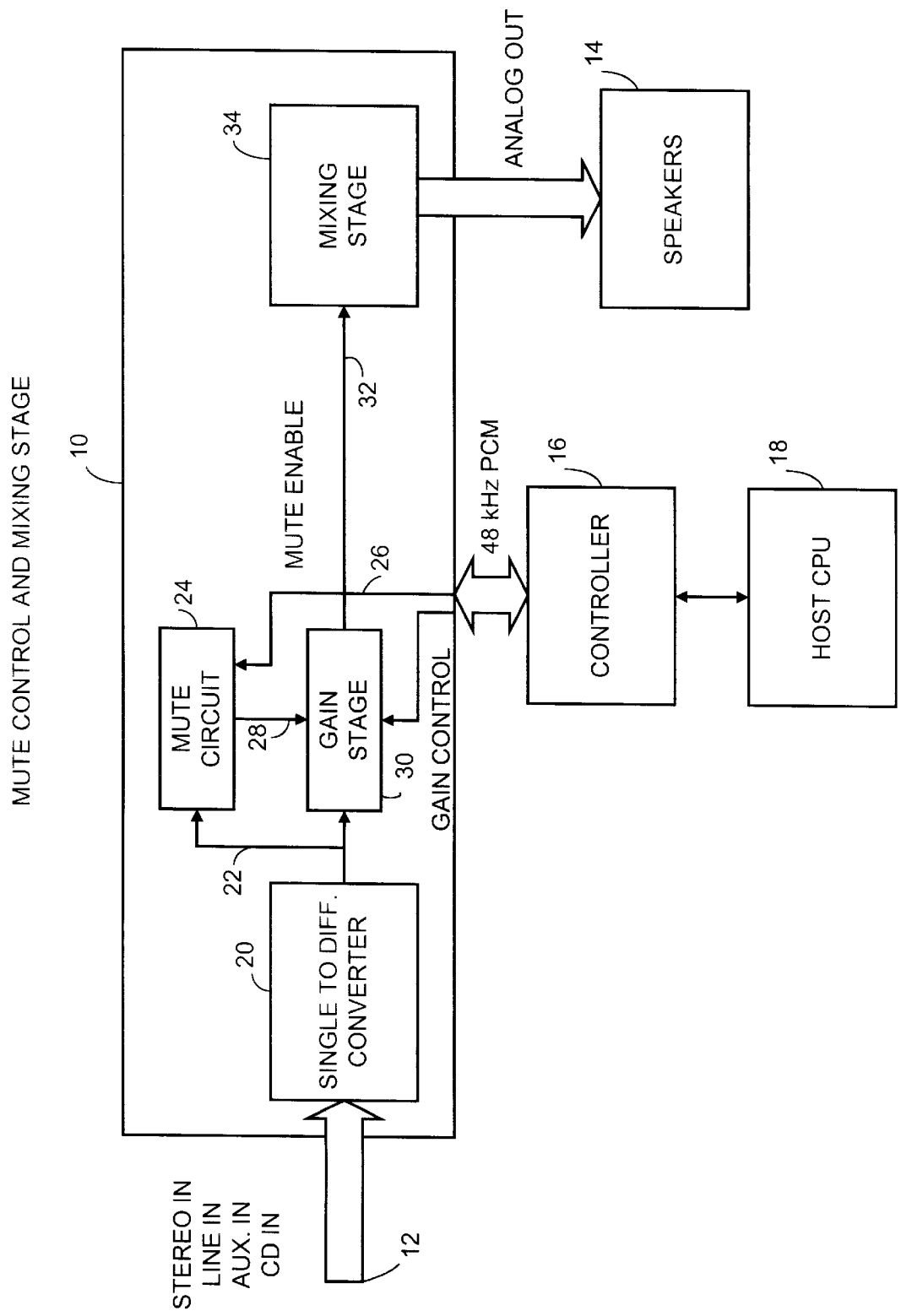
FIG. 1 is a block diagram generally depicting a portion of a computer system containing an audio mute control signal generating circuit in accordance with the invention.

FIG. 1 shows a portion of a digital audio subsystem in a multimedia computer system wherein the computer includes a host mute control and mixing stage 10, such as a portion of an audio codec. Among other functions, the mute control and mixing stage 10 receives audio input 12 and outputs analog audio output to speakers 14. A controller 16 such as a codec controller, communicates to the mute control and mixing stage 10 and sends a plurality of audio streams such as 48 kHz pulse code modulated audio for processing and mixing as desired. A host CPU 18 sends control information to controller 16 to control when audio is necessary or when a mute/unmute is desired.

The mute control and mixing stage 10 includes a single to differential converter 20 that converts analog audio input to a differential output signal 22. An audio mute control signal generating circuit 24 receives the differential input audio 22 and receives an mute/unmute enable signal 26 from controller 16. The audio mute control signal generating circuit 24 generates a mute control signal 28 to control a gain stage 30 to mute or unmnute audio upon a zero crossing of input audio based on a transition of the mute/unmute enable signal 26. Accordingly, the audio mute control signal generating circuit 24 processes the mute enable signal to cause a mute or unmute to occur upon a zero crossing of the input audio signal. The gain stage 30 receives the differential audio input 22 and can also receive digital input, such as gain control commands, from controller 16. Depending upon whether a mute or unmute is required, the gain stage will allow the audio to pass or not pass through the gain stage. Alternatively, the gain stage can amplify or attenuate the audio signal to facilitate a mute or unmute condition. During unmute conditions, the gain stage 30 outputs the differential analog audio 32a and 32b to mixing stage 34 for mixing if desired. Mixing stage 34 performs standard mixing on a plurality of audio streams if desired, and outputs the resultant mixed audio for eventual output to speakers 14.

Figure 2:
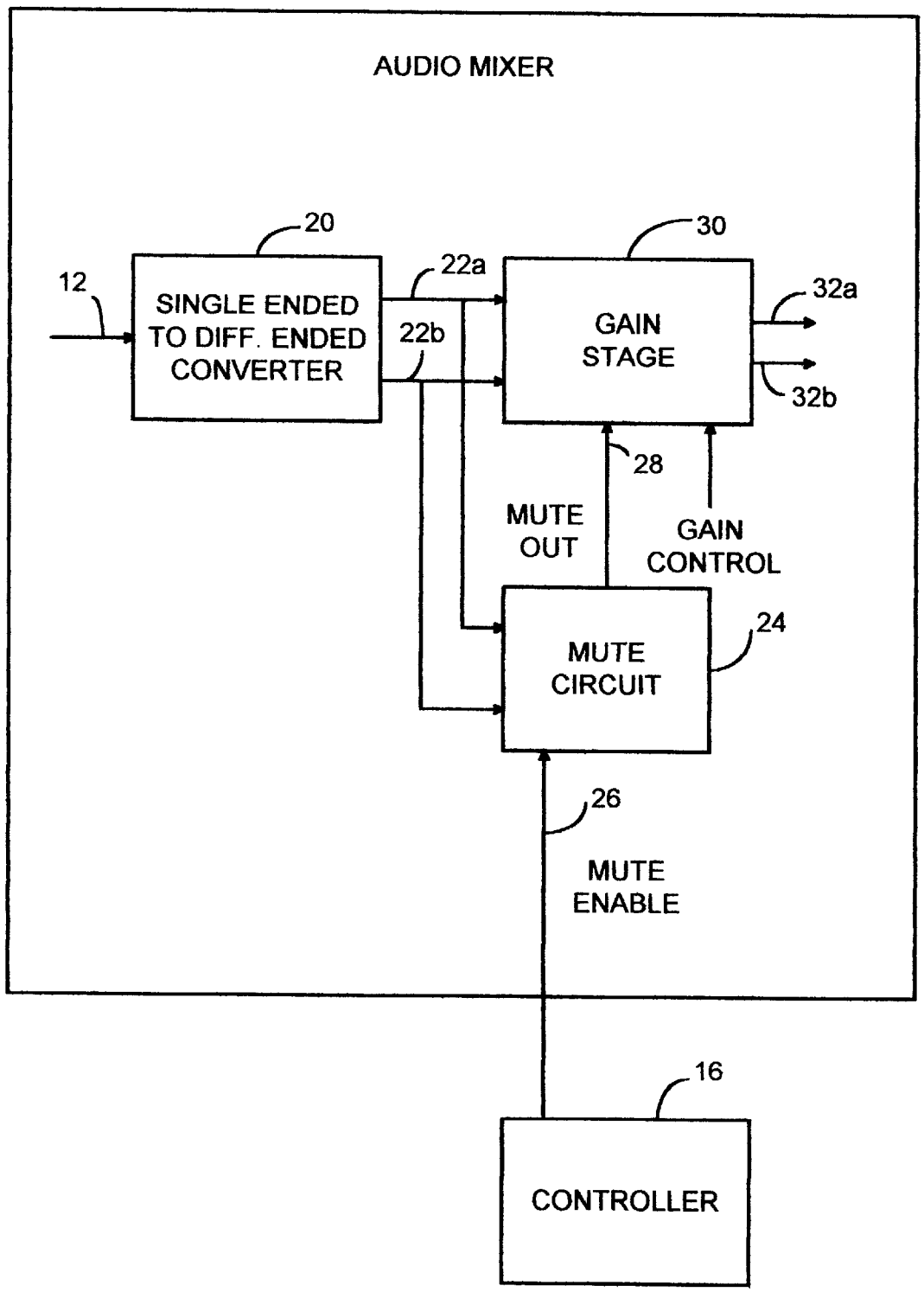
FIG. 2 is a block diagram depicting in more detail an audio mixer in a computer system containing a mute circuit to generate an audio mute control signal in accordance with one embodiment of the invention.

FIG. 2 shows the mute control and mixing stage 10 wherein the single-ended to differential ended converter 20 outputs differential signals 22a and 22b to gain stage 30 and to audio mute control signal generating circuit 24. As further described below, the audio mute control signal generating circuit 24 receives the input audio as differential input and generates a zero-crossing clock signal that varies in frequency proportional to the frequency of the audio signal. Differential audio signals are preferably used to provide increased signal to noise ratios by improving a dynamic range of the signals for processing. Also, the differential audio signals may be more immune to commonmode noise from signal coupling during the mixing process. However, it will be recognized by one of ordinary skill in the art that a non-differential audio input may also be used where differential audio signal processing is not desired.

Figure 3:
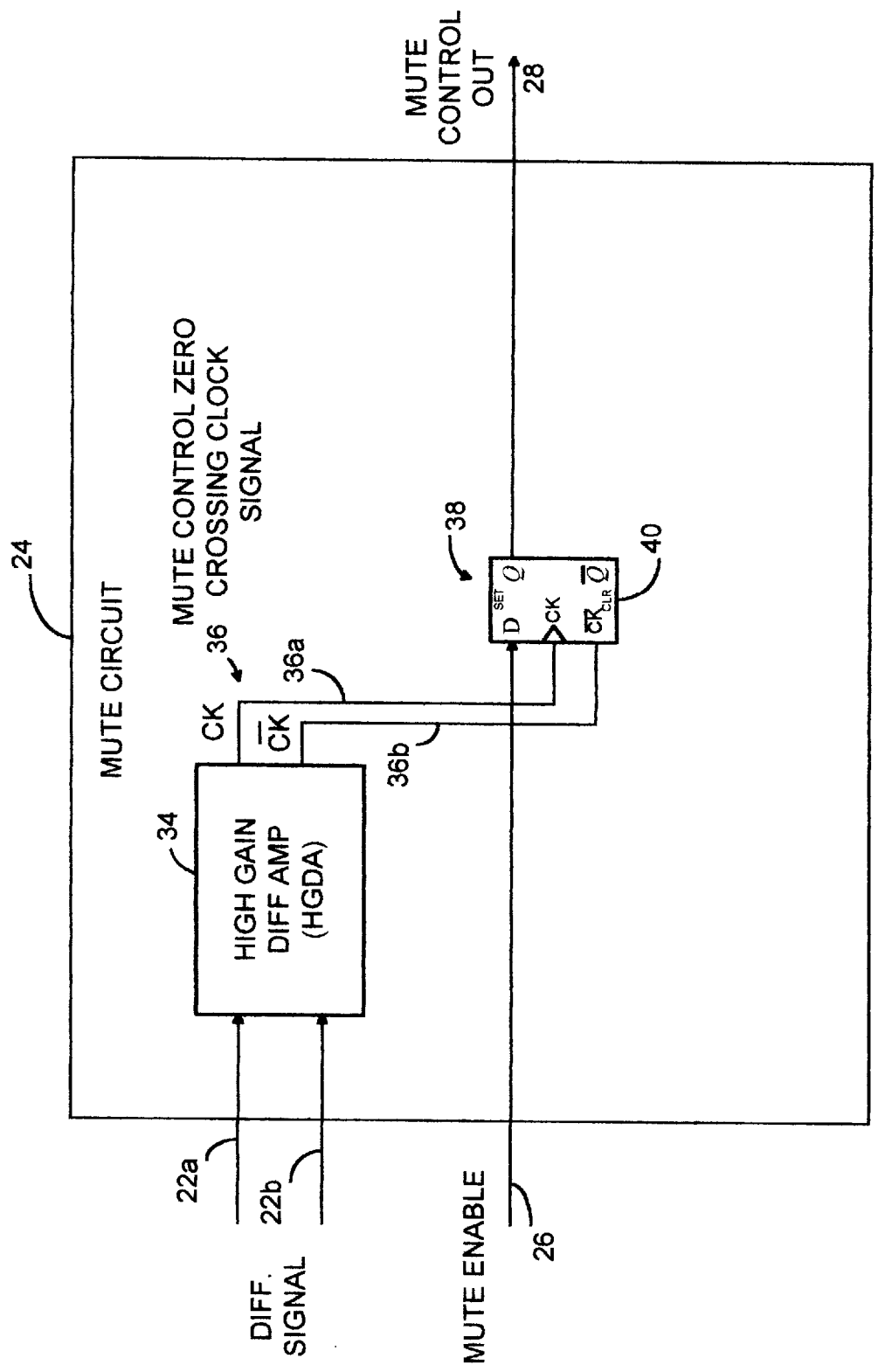
FIG. 3 is a block diagram depicting in more detail the mute circuit of FIG. 2.

FIG. 3 shows the audio mute control signal generating circuit 24 having a high gain differential amplifier 34 which is a cascaded dual operational amplifier. The high gain differential amplifier 34 effectively converts the input audio differential signals 22a and 22b to digital signals. The high gain differential amplifier 34 generates a mute control zero-crossing clock signal 36 which is received by a shift circuit 38.

The shift circuit 38 also receives the mute enable signal 26 which is a digital signal having pulse transitions. The shift circuit 38 shifts a mute enabled signal transition to align with a zero-crossing of the audio input signal and generates a mute/unmute control signal 28 that represents a shifting of the mute enable transition. Preferably, the high gain differential amplifier 34 generates a mute control zero-crossing clock signal 36a and an inverted mute control zero-crossing clock signal 36b. The differential mute control zero-crossing clock signals 36a and 36b that are generated, change at zero-crossings when a mute is activated and when a mute is deactivated.

The shift circuit 38 includes a D flip/flop. As shown, the flip/flop 40 receives the mute enable signal 26 as an input and the mute control zero-crossing clock signals 36a and 36b. An output from flip/flop 40 serves as the mute control signal 28 which controls when mute or unmute occurs. A transition of the mute control signal 28 serves as the mute control input to the gain stage which varies an amount of gain applied to the audio input signal so that the audio input signal is effectively muted in response to the mute enable transition or unmuted in response to a mute enable transition. For example, the gain stage will allow the audio to pass or not pass through the gain stage. Alternatively, the gain stage can amplify or attenuate the audio signal to facilitate a mute or unmute condition.

Figure 4:
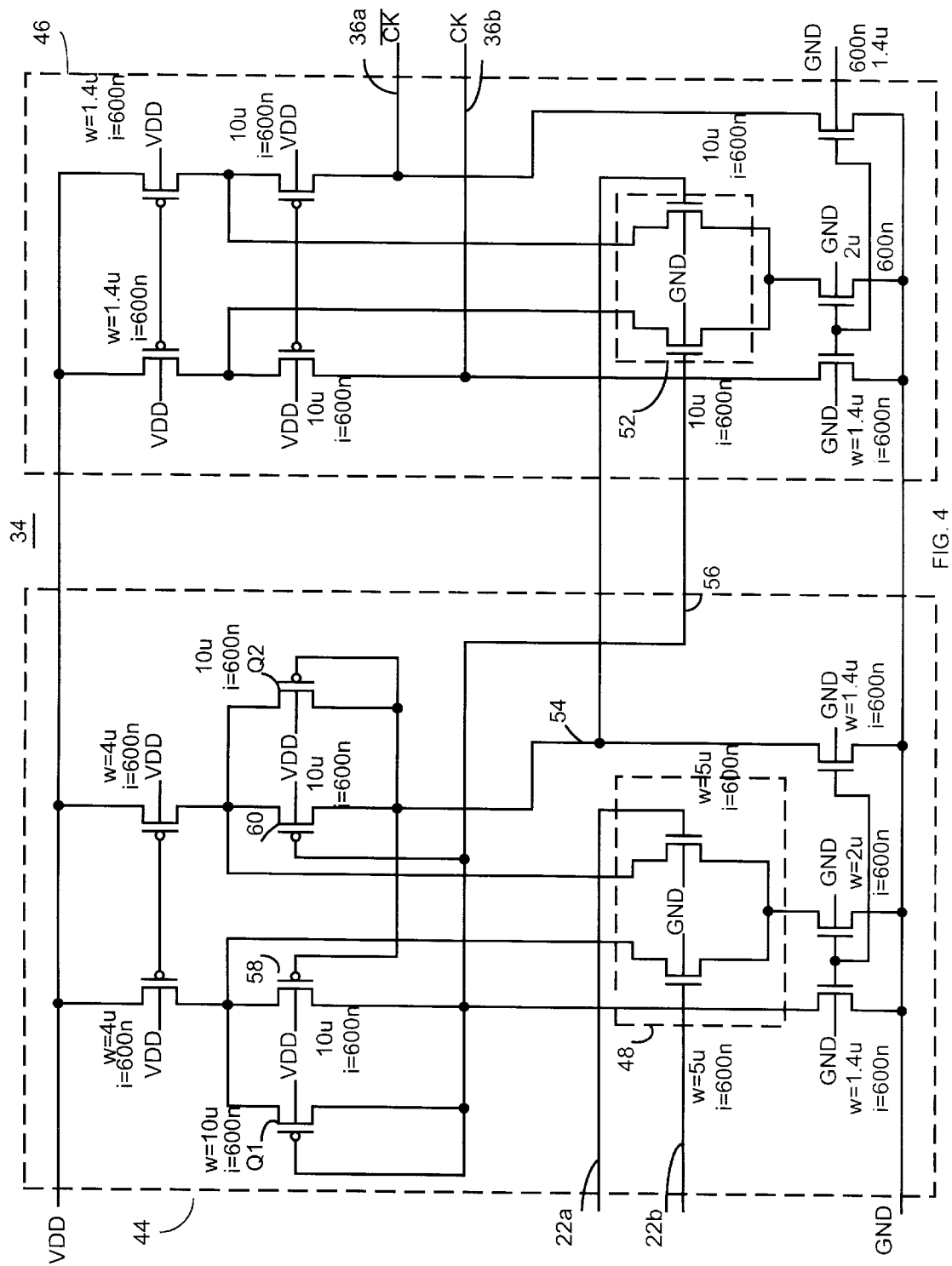
FIG. 4 is a circuit diagram depicting a high gain differential amplifier to facilitate generating an audio mute control signal in accordance with one embodiment of the invention.

FIG. 4 shows the high gain differential amplifier 34 having a first differential operational amplifier stage 44 and a second differential amplifier stage 46 in cascaded arrangement to facilitate in generating the mute control zero-crossing clock signal 36. The differential operational amplifier stage 44 includes an input stage 48 which receives the audio input signal 22a and 22b and also includes a cascade stage 50 which is connected to differential input stage 52 of the second differential operational amplifier 46. The differential operational amplifier 44 includes differential output nodes 54 and 56. The cascade stage 50 includes cascade transistors 58 and 60 each of which is connected to an output node 54 and 56. The size of each transistor is indicated by "1" and "w" where "1" is the channel length of the transistor and "w" is the channel width of the transistor. For example cascade transistor 58 preferably has a channel length of 600 nanometers and a channel width of 10 micrometers.

The differential operational amplifier 46 is a conventional operational amplifier having a pFET and nFET differential amplifier configuration as shown. The differential operational amplifier 44 however includes additional transistors that are coupled to provide feedback to increase an output commonmode voltage from the first differential operational amplifier stage to keep the cascaded second differential operational amplifier stage in an operation mode during fluctuations of the audio input signal 22a and 22b.

Preferably, the transistors are cascade feedback transistors Q1 and Q2, which are coupled to the output nodes 54 and 56 of the differential operational amplifier stage 44. These cascade feedback transistors Q1 and Q2 across each of the differential cascade transistors, provide feedback to increase the input common mode voltage for the second differential operational amplifier stage 46. It will be recognized that the transistors may be any suitable devices such as bipolar transistors or other suitable devices.

Cascade feedback transistor Q1 is connected in parallel across cascade transistor 58 and is connected to a differential input of input stage 52 (output node 54) of the cascaded second differential amplifier stage 46. Similarly, cascade feedback transistor Q2 is connected in parallel across the cascade transistor 60 and is connected to the other differential input (node 56) in input stage 52 of the cascaded second differential operational amplifier stage 46. As shown, gates of cascade transistor 58 and cascade feedback transistor Q1 are each coupled to a different differential input of the second stage. Likewise, gates of cascade transistor 60 and cascade feedback transistor Q2 are each coupled to a different differential input of the second stage. The gate of the cascade feedback transistor Q1 is coupled to a drain of a corresponding cascade transistor 58 and to a gate of the other cascade transistor 60. Similarly, the gate of the cascade feedback transistor Q2 is coupled to a drain of a corresponding cascade transistor 60 and to a gate of the other cascade transistor 58. The cascade feedback transistors Q1 and Q2 facilitate a negative feedback loop within the cascade stage of the first differential operational amplifier stage 44. The cascade feedback transistors Q1 and Q2, as shown, are preferably field effect transistors as are all of the transistors in the high gain differential amplifier 34.

The audio mute control signal generating circuit 24 is preferably part of an audio mixer circuit 10 for mixing the audio input signal 22 with other audio input such as the 48 kHz pulse code modulated audio streams from controller 16. The audio mute control signal generating circuit is preferably fabricated as an integrated circuit on a chip.

The high gain differential amplifier 34 preferably has a common mode input voltage of 1.5 volts. With the inclusion of the cascade feedback transistors Q1 and Q2, at low input signal levels for input signals 22a and 22b, the cascade feedback transistors Q1 and Q2 have resulting increasing channel conductance to oppose the drop in output common mode voltage. For example, in a mute processing system using differential operational amplifiers that do not have added common mode feedback, an input audio signal of 100 mV in a first stage having a common mode output voltage of approximately 0.5 V, would not typically be detected by the second cascaded stage. However, the cascade feedback transistors Q1 and Q2 allow detection of such low input audio signals.

Also, the cascade feedback transistors Q1 and Q2 facilitate activation of at least one of the second stage differential inputs 54 or 56 for larger input signal levels 22a and 22b by effectively keeping an output of the first stage differential amplifier above an input voltage threshold of an input transistor in either of the second stage differential input stages. As a result, the above identified system is a low cost solution to control the output commonmode of the first stage and to enable the circuit to operate under wide process variations with minimum silicon are requirements and requiring minimal simulation effort.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An audio mute control signal generating circuit comprising:
    means for amplifying an audio input signal using a first differential operational amplifier stage and a second differential operational amplifier stage in cascaded arrangement with the first differential operational amplifier stage, to generate a mute control zero-crossing clock signal; and
    means, responsive to the mute control zero-crossing clock signal and a mute enable signal transition, for shifting the mute enable transition to align with a zero-crossing of the audio input signal.

2. The audio mute control signal generating circuit of claim 1 wherein the first differential operational amplifier stage has transistors operatively coupled for providing feedback to increase a common mode voltage from the first differential operational amplifier stage to keep the cascaded second differential operational amplifier stage on during fluctuations of the audio input signal.

3. The audio mute control signal generating circuit of claim 2 wherein the transistors are comprised of cascade feedback transistors, operatively coupled to an output node of the first differential operational amplifier stage, for providing feedback to increase a commonmode voltage from the first differential operational amplifier stage to keep the cascaded second differential operational amplifier stage on during fluctuations of the audio input signal.

4. The audio mute control signal generating circuit of claim 2 wherein the first differential operational amplifier stage includes:
    a first differential amplifier output node and a first cascade transistor coupled to the first differential amplifier output node;
    a second differential amplifier output node and a second cascade transistor coupled to the second differential amplifier output node;
    a first cascade feedback transistor operatively coupled across the first cascade transistor and operatively coupled to a first differential input of the cascaded second differential operational amplifier stage; and
    a second cascade feedback transistor operatively coupled across the second cascade transistor and operatively coupled to a second differential input of the cascaded second differential operational amplifier stage.

5. The audio mute control signal generating circuit of claim 4 wherein the first and second cascade feedback transistors are operatively coupled to an output node of the first differential operational amplifier stage, for providing feedback to increase a commonmode voltage from the first differential operational amplifier stage to keep the cascaded second differential operational amplifier stage on during fluctuations of the audio input signal.

6. The audio mute control signal generating circuit of claim 1 wherein the means for amplifying generates a mute control zero-crossing clock signal as a first mute control zero-crossing clock signal and an inverted second mute control zero-crossing clock signal and wherein the means for shifting includes a flip flop circuit that receives the first mute control zero-crossing clock signal, the inverted second mute control zero-crossing clock signal and the mute enable signal transition and that generates a mute control output signal in response to the first mute control zero-crossing clock signal, the inverted second mute control zero-crossing clock signal and the mute enable signal transition wherein the mute control output signal represents a shifting of the mute enable transition to align with a zero-crossing of the audio input signal.

7. The audio mute control signal generating circuit of claim 6 wherein the mute control signal controls an amount of gain applied to the audio input signal so that the audio input signal is effectively muted in response to the mute enable transition.

8. The audio mute control signal generating circuit of claim 6 wherein the circuit is in an audio mixer circuit for mixing the audio input signal with other audio input and the circuit fabricated as an integrated circuit on a chip.

9. An audio mute control signal generating circuit comprising:

means for amplifying an audio input signal using a first differential operational amplifier stage and a second differential operational amplifier stage in cascaded arrangement with the first differential operational amplifier stage, to generate a first mute control zero-crossing clock signal and an inverted second mute control zero-crossing clock signal, wherein the first differential operational amplifier stage further has transistors operatively coupled for providing feedback to increase a commonmode voltage from the first differential operational amplifier stage to keep the cascaded second differential operational amplifier stage on during fluctuations of the audio input signal; and means, responsive to the mute control zero-crossing clock signal and a mute enable signal transition, for shifting the mute enable transition to align with a zero-crossing of the audio input signal, including means for receiving the first mute control zero-crossing clock signal, the inverted second mute control zero-crossing clock signal and the mute enable signal transition and for generating a mute control signal that represents a shifting of the mute enable transition to align with a zero-crossing of the audio input signal.

10. The audio mute control signal generating circuit of claim 9 wherein the transistors are comprised of cascade feedback transistors, operatively coupled to an output node of the first differential operational amplifier stage, for providing feedback to increase a commonmode voltage from the first differential operational amplifier stage to keep the cascaded second differential operational amplifier stage on during fluctuations of the audio input signal.

11. The audio mute control signal generating circuit of claim 9 wherein of the first differential operational amplifier stage includes:

a first differential amplifier output node and a first cascade transistor coupled to the first differential amplifier output node;

a second differential amplifier output node and a second cascade transistor coupled to the second differential amplifier output node;

a first cascade feedback transistor operatively coupled across the first cascade transistor and operatively coupled to a first differential input of the cascaded second differential operational amplifier stage; and a cascade second feedback transistor operatively coupled across the second cascade transistor and operatively coupled to a second differential input of the cascaded second differential operational amplifier stage.

12. The audio mute control signal generating circuit of claim 11 wherein the first and second cascade feedback transistors are operatively coupled to an output node of the first differential operational amplifier stage, for providing feedback to increase a commonmode voltage from the first differential operational amplifier stage to keep the cascaded second differential operational amplifier stage on during fluctuations of the audio input signal.

13. The audio mute control signal generating circuit of claim 9 wherein the means for receiving and the means for generating are flip flop circuits and the mute control signal controls an amount of gain applied to the audio input signal so that the audio input signal is effectively muted in response to the mute enable transition.

14. The audio mute control signal generating circuit of claim 9 wherein the circuit is in an audio mixer circuit for mixing the audio input signal with other audio input and the circuit fabricated as an integrated circuit on a chip.

* * * * *